(12) United States Patent
Schneider

(10) Patent No.: US 10,952,328 B2
(45) Date of Patent: Mar. 16, 2021

(54) SYSTEM AND METHOD FOR CIRCUIT BOARD DESIGN AND MANUFACTURING

(71) Applicant: Patchr, Inc., Austin, TX (US)

(72) Inventor: Eric Schneider, Austin, TX (US)

(73) Assignee: Patchr, Inc., Austin, TX (US)

( * ) Notice: Subject to any disclaimer, the term of this patent is extended or adjusted under 35 U.S.C. 154(b) by 196 days.

(21) Appl. No.: 16/184,319

(22) Filed: Nov. 8, 2018

(65) Prior Publication Data
US 2019/0141837 A1    May 9, 2019

Related U.S. Application Data

(60) Provisional application No. 62/583,782, filed on Nov. 9, 2017.

(51) Int. Cl.
*G06F 30/392*     (2020.01)
*H05K 3/00*       (2006.01)
*G06F 30/394*     (2020.01)

(52) U.S. Cl.
CPC ......... *H05K 3/0005* (2013.01); *G06F 30/392* (2020.01); *G06F 30/394* (2020.01)

(58) Field of Classification Search
CPC .... H05K 3/0005; G06F 30/392; G06F 30/394
USPC ....................................................... 716/137
See application file for complete search history.

(56) References Cited

U.S. PATENT DOCUMENTS

| | | | |
|---|---|---|---|
| 10,043,222 B1* | 8/2018 | Bromley | G06Q 50/04 |
| 2008/0141209 A1* | 6/2008 | Kashiwakura | G06F 30/39 716/114 |
| 2013/0113394 A1* | 5/2013 | Ido | H05B 45/20 315/297 |
| 2013/0326457 A1* | 12/2013 | MacMunn | G06F 30/392 716/122 |
| 2014/0123088 A1* | 5/2014 | Tanisho | G06F 11/366 716/107 |
| 2015/0302130 A1* | 10/2015 | Hirschman | G06F 3/04847 716/137 |
| 2016/0171143 A1* | 6/2016 | Suiter | G06F 30/392 716/112 |
| 2016/0171144 A1* | 6/2016 | Suiter | G06F 30/392 716/112 |
| 2016/0371402 A1* | 12/2016 | Suiter | G06F 30/327 |
| 2018/0218099 A1* | 8/2018 | Laing | G01R 31/31704 |
| 2019/0370417 A1* | 12/2019 | Aarras | G06F 30/39 |

\* cited by examiner

*Primary Examiner* — Suchin Parihar
(74) *Attorney, Agent, or Firm* — Traverse Legal, PLC

(57) ABSTRACT

A system and a method for allowing users to quickly and cost-effectively design and make functional circuit boards, without the need for the users to have any specialized education or training. The system allows users to define a footprint for the circuit board to be designed. The system maintains information associated with each of the circuit board components and uses this information to help users determine where to place the components, add ancillary components, and make connections between these components.

13 Claims, 3 Drawing Sheets

SYSTEM AND METHOD FOR CIRCUIT BOARD DESIGN AND MANUFACTURING

PRIORITY CLAIM

This patent application claims priority to and the benefit of the filing date of the provisional patent application U.S. Ser. No. 62/583,782 filed on Nov. 9, 2017, which is incorporated herein in its entirety.

FIELD

This patent application generally relates to a system and a method for designing and manufacturing circuit boards.

BACKGROUND

There are many tools available to large companies to design circuit boards for their products. These companies typically have many resources that can be made available when it is necessary to design a circuit board. These resources include complex and expensive software packages, as well as design engineer who are well educated in the field of circuit board design and who are trained in the use of the company's specific design tools.

Companies and individuals typically do not have the resources to purchase or maintain specialized software packages that are conventionally used in circuit board design nor do they have the specialized training or expertise of engineers or technicians familiar with specialized software packages. As such, conventional circuit board design tools require high levels of resources and expertise, which is particularly a problem under tight time constraints. This results in very long development/design times, high rates of errors, and high costs.

Accordingly, there exists a need for a system and a method for quickly designing and manufacturing circuit boards without any specialized training or tools. Also, there exists a need for a system and a method for quickly designing and manufacturing circuit boards that have fewer errors, are easy to use, and are cost effective.

SUMMARY

What is provided is a system and a method for allowing users to quickly and cost-effectively design and make functional circuit boards, without the need for the users to have any specialized education or training. In an embodiment, the system comprises a client computing device operably configured to define an impression for the circuit board and to select one or more first components for placement on the circuit board. The system also comprises a central database operably configured to store data and/or information associated with the circuit board and the first components and a database server operably configured to obtain data and/or information from the central database, wherein the data and/or information is associated with one or more regions and/or one or more rules for placement of the first components on the circuit board. The system further comprises an API server operably configured to receive and transmit data received from the client computing device and a computing platform with a graphical user interface configured for display of the designed circuit board.

In an exemplary embodiment, the computer-implemented method for designing and making a circuit board comprises defining an impression for the circuit board; selecting one or more first components for placement on the circuit board; obtaining data and/or information associated with one or more regions and/or one or more rules for placement of the first components on the circuit board; identifying one or more second components based on the selection of the first components, wherein the second components are ancillary to the first components; identifying a connection between each of the first components and each of the second components; placing the first components on the circuit board; placing the second components on the circuit board and making the connection between each of the first components and each of the second components based on the placement of the first components; determining whether any additional first components will be placed on the circuit board; and generating an image of the designed circuit board.

In some embodiments, the method further comprises exporting data and/or information associated with the designed circuit board and transmitting the data and/or information to a manufacturing tool, wherein the manufacturing tool is configured to make the designed circuit board.

The following detailed description together with the accompanying drawings will provide a better understanding of the nature and advantages of the present invention.

BRIEF DESCRIPTION OF THE DRAWINGS

The above, as well as other advantages of the present disclosure, will become readily apparent to those skilled in the art from the following detailed description when considered in light of the accompanying drawings in which.

DETAILED DESCRIPTION

Figure 1:
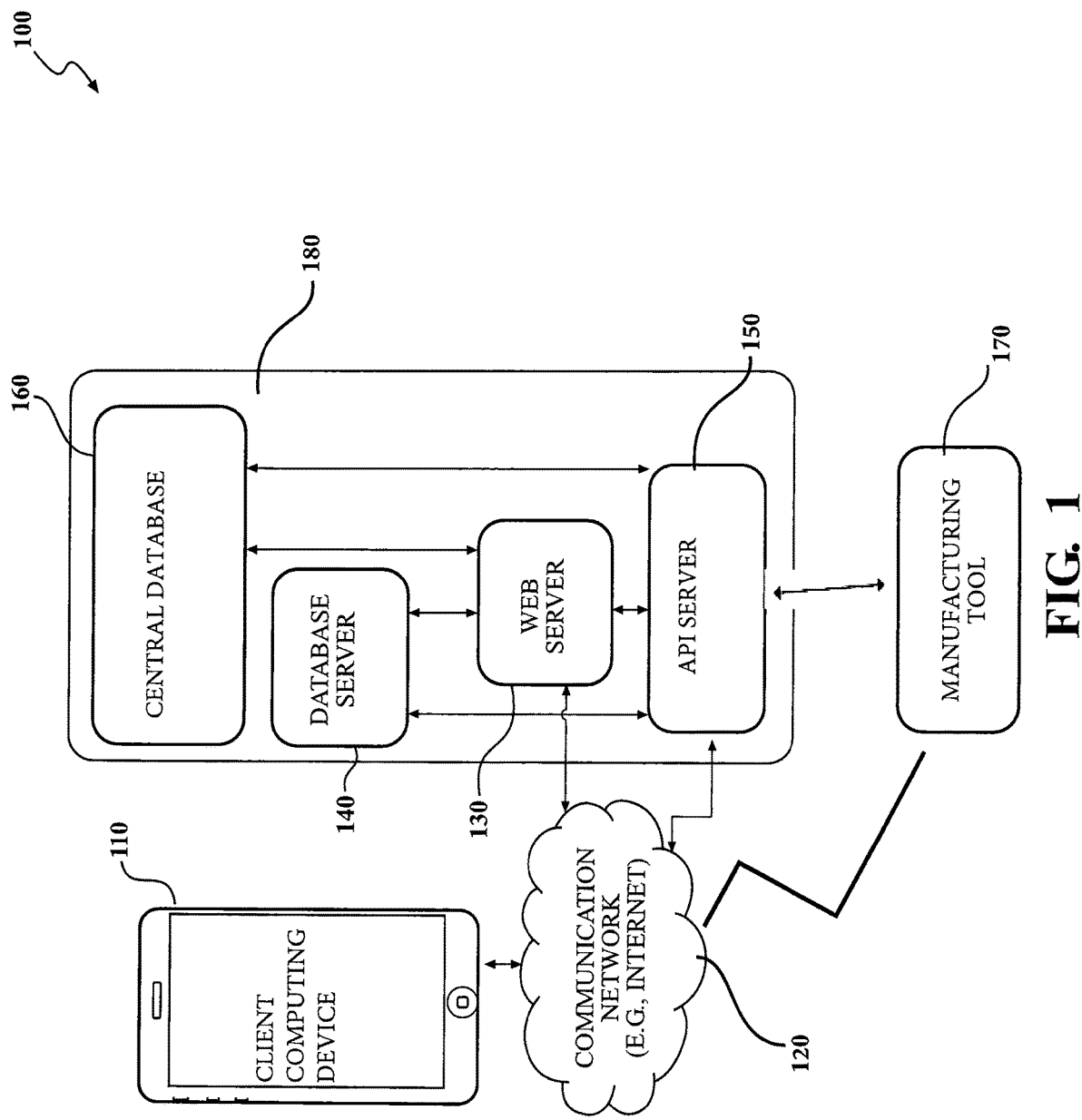
FIG. 1 is a block diagram schematic of a block diagram schematic of an exemplary system for designing and manufacturing a circuit board.

In the following detailed description, numerous specific details are set forth in order to provide a thorough understanding of the examples as defined in the claimed subject matter, and as an example of how to make and use the examples described herein. However, it will be understood by those skilled in the art that claimed subject matter is not intended to be limited to such specific details, and may even be practiced without requiring such specific details. In other instances, well-known methods, procedures, and components have not been described in detail so as not to obscure the examples defined by the claimed subject matter.

Some portions of the detailed description that follow are presented in terms of algorithms and/or symbolic representations of operations on data bits and/or binary digital signals stored within a computing system, such as within a computer and/or computing system memory. An algorithm is here and generally considered to be a self-consistent sequence of operations and/or similar processing leading to a desired result. The operations and/or processing may take the form of electrical and/or magnetic signals configured to be stored, transferred, combined, compared and/or otherwise manipulated. It has proven convenient at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device that manipulates and/or transforms data represented as physical electronic and/or magnetic quantities and/or other physical quantities within the computing platform's processors, memories, registers, and/or other information storage, transmission, and/or display devices.

Unless specifically stated otherwise, as apparent from the following discussion, it is appreciated that throughout this specification a computing platform includes, but is not limited to, a device such as a computer or a similar electronic computing device that manipulates and/or transforms data represented by physical, electronic, and/or magnetic quantities and/or other physical quantities within the computing platform's processors, memories, registers, and/or other information storage, transmission, reception and/or display devices. Accordingly, a computing platform refers to a system, a device, and/or a logical construct that includes the ability to process and/or store data in the form of signals. Thus, a computing platform, in this context, may comprise hardware, software, firmware and/or any combination thereof. Where it is described that a user instructs a computing platform to perform a certain action, it is understood that "instructs" may mean to direct or cause to perform a task as a result of a selection or action by a user. A user may, for example, instruct a computing platform embark upon a course of action via an indication of a selection, including, for example, pushing a key, clicking a mouse, maneuvering a pointer, touching a touch pad, touching a touch screen, acting out touch screen gesturing movements, maneuvering an electronic pen device over a screen, verbalizing voice commands, and/or by audible sounds. A user may include an end-user.

Flowcharts, also referred to as flow diagrams by some, are used in some figures herein to illustrate certain aspects of some examples. Logic they illustrate is not intended to be exhaustive of any, all, or even most possibilities. Their purpose is to help facilitate an understanding of this disclosure with regard to the particular matters disclosed herein. To this end, many well-known techniques and design choices are not repeated herein so as not to obscure the teachings of this disclosure.

Throughout this specification, the term "system" may, depending at least in part upon the particular context, be understood to include any method, process, apparatus, and/or other patentable subject matter that implements the subject matter disclosed herein. The subject matter described herein may be implemented in software, in combination with hardware and/or firmware. For example, the subject matter described herein may be implemented in software executed by a hardware processor.

Referring to FIG. 1, FIG. 1 shows a block diagram schematic of an exemplary system 100 for designing and manufacturing a circuit board. The system 100 includes a client computing device 110 and a circuit board design system 180. The circuit board design system 180 includes a web server 130, a database server 140 (e.g., circuit board design server), an application program interface (API) server 150, and a central database 160.

The client computing device 110 is operably configured to allow a user to transmit information in the system 100 using a communication network 120, such as the Internet. The client computing device 110 may be a laptop, tablet, cellular phone, handheld device, watch, or any other functionally equivalent computing device capable of connecting to the communication network 120. The operating system on the client computing device 110 may be APPLE® iOS, GOOGLE ANDROID®, or WINDOWS®, or a functionally equivalent operating system.

The web server 130 may be known as a circuit board design server. The web server 130 is operably configured to provide a web-based user interface for users to design and manufacture a circuit board on the system 100. The web-based user interface allows for users, via their client devices 120, to create any idea for a circuit board and then for the circuit board to be designed and customized with desired components.

The central database 160 stores internal file formats for components that allows the system 100 to readily catalog, customize, and identify the components. The internal file formats are configured to be easily converted to open standard formats, such as Gerber X2.

The web server 130 communicates with the database server 140 when data and/or information from users is accessed or transmitted. The database server 140 is operably configured to execute modules of the system 100 and to provide access to databases for storing all data related to the system 100, including, but not limited to, the central database 160. The central database 160 stores and maintains data and information associated with each of the components of a circuit board and with the selections of users in the database 160. The database 160 may be maintained by administrators and/or users of the system 100.

Non-limiting examples of the modules on the system 100 executed by the database server 140 include those responsible for component placement information, required ancillary components, component connection information, and 2-D/3-D component information on the circuit board being designed. Components for constructing a circuit board may be created and/or modified in the system 100 using an on rails component manipulation process that is designed to gather all required information to create a valid component.

The API server 150 is the junction for most of the data transmitted/received by users. Third party service providers, such as manufacturers, may communicate directly with the API server 150. In some embodiments, the system 100 can generate its own request to a third-party HTTP link.

In an embodiment, the system 100 further includes a manufacturing tool 170, as depicted in FIG. 1. The manufacturing tool 170 is operably configured for constructing a circuit board after it has been designed in the system 100. The manufacturing tool 170 may include its own API and may communicate with the client computing device 110, the web server 130, and/or the database server 140 via the communication network 120 and the API server 150.

In an alternative embodiment, the database server 140 may be configured to generate and export files, such as Gerber files, that may be stored and later provided to the manufacturing tool 170.

In another alternative embodiment, the database server 140 may be configured to generate and export data for a PCB printer.

Each of the web server 130, the database server 140, and the API server 150 may have one or more processors capable of performing tasks, such as all or a portion of the methods described herein. Each of the web server 130, the database server 140, and the API server 150 is in communication with and/or has integral memory in one or more examples.

Memory may be any type of local, remote, auxiliary, flash, cloud, or other memory known in the art. In some embodiments, the memory is non-transitory.

In an embodiment, the system 100 may be configured with bash scripts under source control using packer.io templates to provide a repeatable server-creation process. The system 100 may be decomposed into several micro-services that each management specific aspects.

Figure 2:
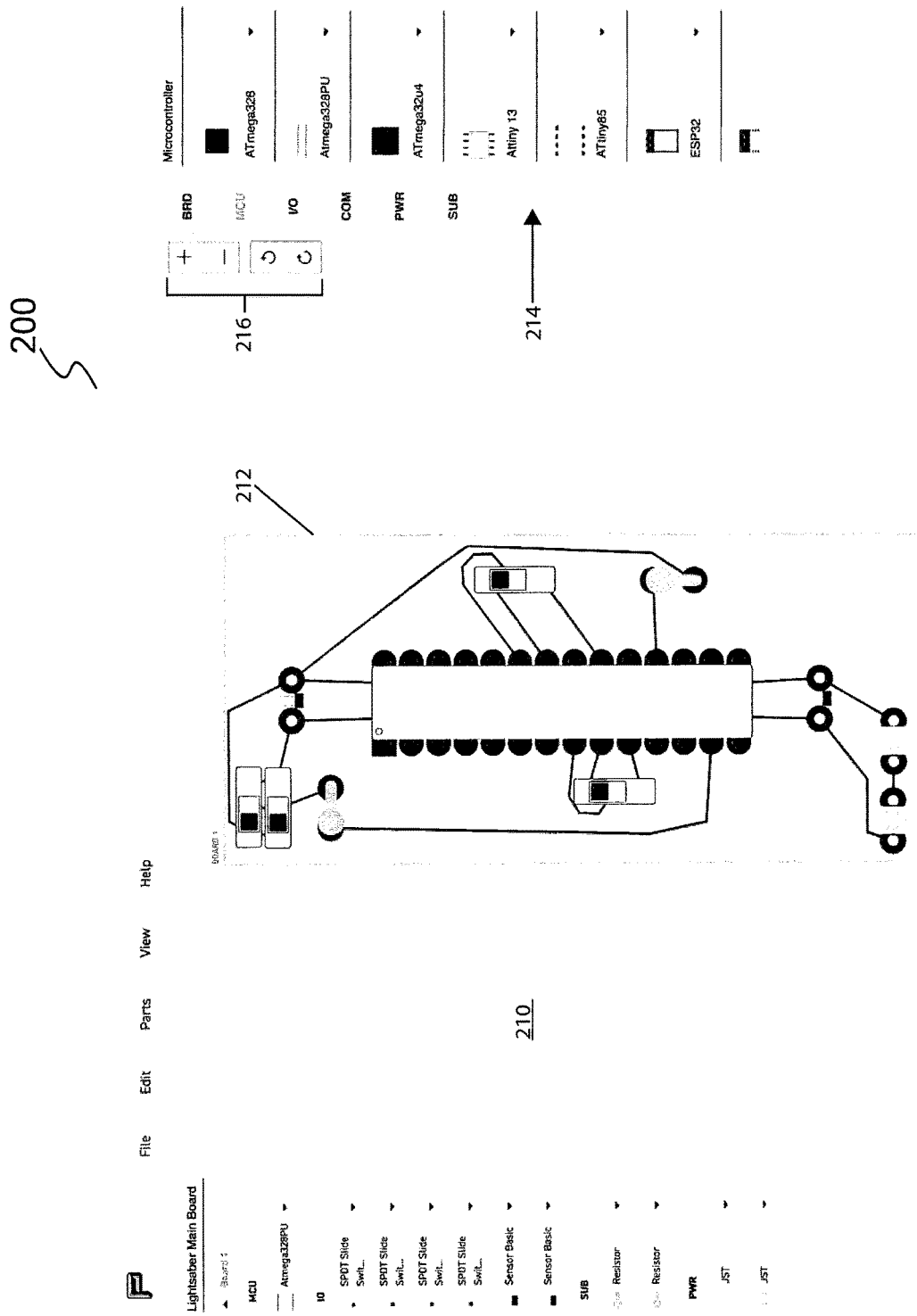
FIG. 2 is a graphical user interface (GUI) drawing illustrating an example GUI for designing a circuit board using the system illustrated in FIG. 1.

Referring to FIG. 2, FIG. 2 shows a graphical user interface (GUI) drawing illustrating an example GUI 200 for designing a circuit board using the system 100 illustrated in FIG. 1. The GUI 200 includes a central viewing area 210 in which the circuit board design is created. The user, via the client computing device 110, initially defines an impression or footprint 212 for the circuit board. In some embodiments, the footprint 212 may be selected from a set of predefined sizes and/or shapes. In other embodiments, the user may define a unique footprint 212 for the circuit board by drawing/customizing the dimensions of the circuit board. FIG. 2 shows a non-limiting example of such a design where the footprint 212 has an irregular 6-sided shape.

The GUI 200 further includes a design menu 214 that is provided to the user for selecting from a plurality of options once the footprint 212 has been defined. Non-limiting examples of some of the options include microcontroller selection, pad type, inputs/outputs (I/O), board voltage, power source, communication mechanism, and/or boot source. The user can either manually select a pad location or enable the system 100 to automatically select the location of the pad.

The user, through the GUI 200, may also select to include a plurality of other components to include on the circuit board. Non-limiting examples of some of these other components are resistors, voltage regulators, diodes, crystals, oscillators, resonators, transistors, antennas, shift registers, light emitting diodes, buttons, and the like. In some embodiments, the system 100 may present options of these other components to the user through the GUI 200.

The GUI 200 further includes buttons 216 that are operably configured to move the displayed circuit board design, zoom in or out, view different layers of the circuit board, and/or manipulate other viewing options.

Figure 3:
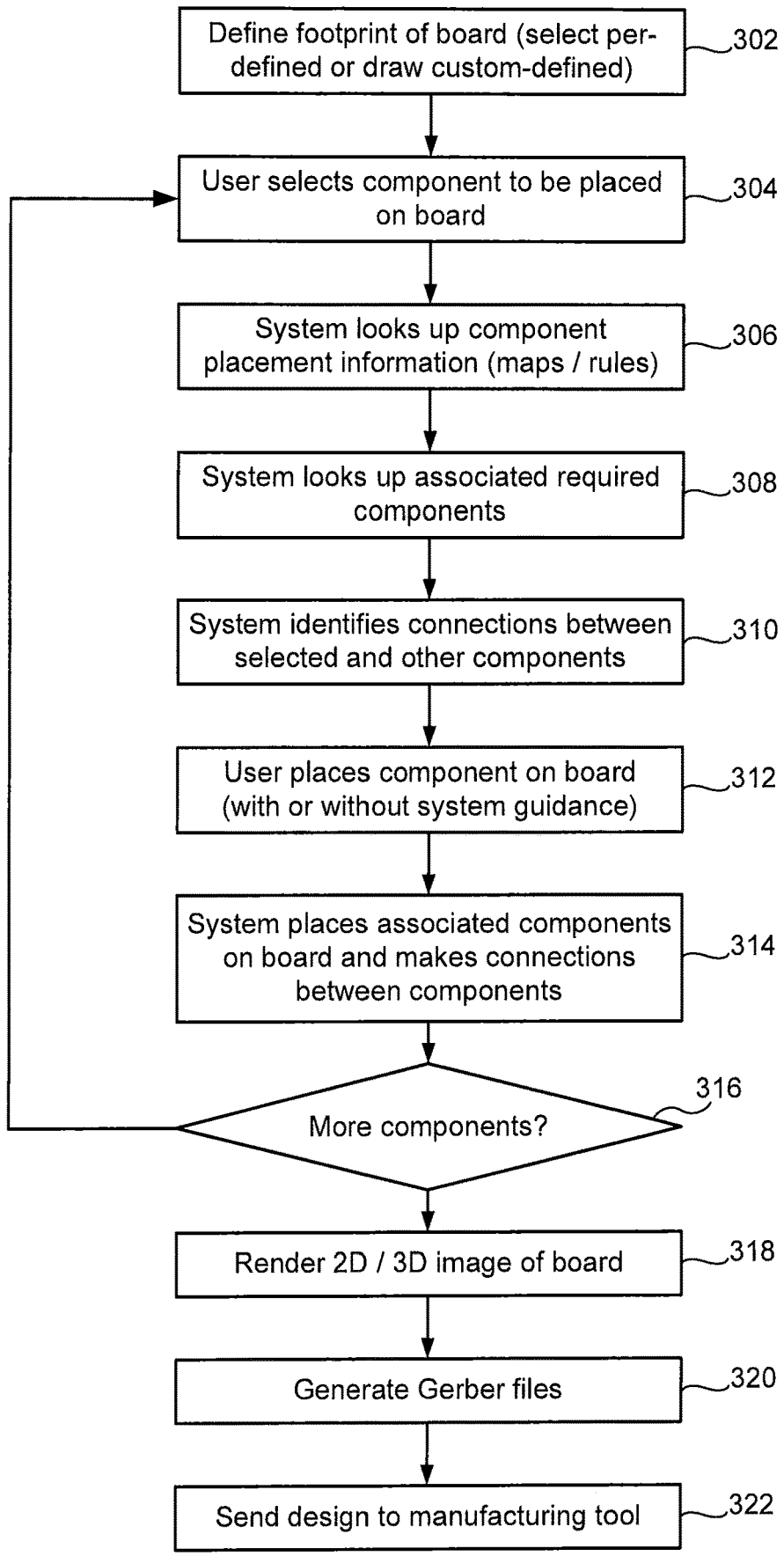
FIG. 3 is a flow chart showing an exemplary method for designing and manufacturing a circuit board using the system illustrated in FIG. 1.

Referring to FIG. 3, FIG. 3 shows a flow chart showing an exemplary method 300 for designing and manufacturing a circuit board using the system 100 illustrated in FIG. 1. As shown in block 302, the method 300 commences with the selection or definition of an idea/footprint for the circuit board. In some embodiments, the system 100 provides the user with a number of predefined shapes and sizes of a circuit board that may be selected by the user. In other embodiments, system 100 is configured to allow the user to customize the dimensions of a circuit board. The customization of a circuit board may be desired when the circuit board is intended to be mounted within a uniquely-shaped package/container. For example, the created circuit board may need to fit around product components, such as speakers, displays, etc.

After the idea/footprint of the circuit board has been defined, the user selects component to be placed on the circuit board, as shown in block 304. In some embodiments, the first component to be selected is a microcontroller/microprocessor.

In one embodiment, the system 100 retrieves data and/or information from the central database 160 associated with the placement of the component, as shown in block 306. This information, such as regions on the circuit board and rules, helps guide the user to place the component in a preferred location when using the system 100.

When a microprocessor is selected, for example, the microprocessor may have pins on all fours sides, so it may be preferable to place the microprocessor away from the edge of the circuit board to ensure that all of the pins are accessible and that there is enough room to route traces to each of the pins.

If the user has selected a predefined circuit board size and/or shape, the preferred mounting locations for a component may be represented by regions (i.e. maps) of the preferred locations on the circuit board. The regions may also identify areas where the placement of corresponding components is strongly discouraged or even prohibited.

In addition to information relating to the placement of a selected component, the database server 140 may search for and identify additional components in the central database 160 that are used in conjunction with the selected component, as shown in block 308. For example, if the user selects a particular microprocessor, that microprocessor may require a crystal that generates a clock input for the microprocessor, and it may be necessary to couple capacitors to the crystal. As a result, when the user selects the microprocessor, the database server 140 retrieves the information associated with the microprocessor, which defines the need for the crystal and the capacitors.

Next, as shown in block 310, the database server 140 retrieves information from the central database 160 and identifies connections between a selected component and additional, ancillary components on the circuit board. The system 100 may be configured to make connections between the components without the user needing to take any action to make the connections or without the user needing to have any specific knowledge or training regarding the necessity of these connections. In some examples, the system 100 automatically makes connections between selected components, such as a microprocessor, and ancillary components, such as a crystal and capacitors.

The user then places the selected component(s) on the circuit board using the client computing device 110, as shown in block 312. The selected component(s) may be placed on the circuit board with or without guidance from the system 100. Non-limiting examples of placing the selected component(s) on the circuit board involve dragging and dropping the component(s) from a component library or menu located in the central database 160 to the footprint within the GUI 200.

In some embodiments, as shown in block 314, the system 100 places additional, ancillary components on the circuit board and makes the connections between the previously-placed components in block 312 and the newly-placed components. In some cases, there may only be one additional, ancillary component placed on the circuit board. For example, the system 100 may identify the clock-in and clock-out pins of the microprocessor and make connections between these pins, the clock outputs of the crystal, and the capacitors.

In some embodiments, the additional, ancillary components are automatically placed on the circuit board by the system 100 without requiring any decision to be made by the user or for the user to know that these components are necessary. The system 100 may be configured to automatically position the additional components based on the positioning of the selected components or it may allow the user to reposition the additional components in user-selected locations.

The process 300 then proceed to an evaluation block 316 where it is determined whether the user will place additional components on the circuit board. If the user desires to place more components on the circuit board, the process 300 returns to block 304 and is repeated through block 316. In an embodiment, the user may also manually make any necessary connections between any of the components already placed on the circuit board.

Once the user has finished placing components on the circuit board, the user may select several output options provided by the web server 130 for viewing the design, as shown in block 318. A non-limiting example of an output option is to render an image of the design of the circuit board. Even though a two-dimensional (2-D) rendering of the circuit board is continuously displayed on the GUI 200 as it is being designed, the system 100 may also generate a 3-dimensional (3-D) rendering of the circuit board. The central database 160 stores 3-D information associated with each of the components in the central database 160. The 3-D information includes this information with the components that are selected and placed on the circuit board by the user.

In an embodiment, the system 100 may generate a 3-D rendering of the circuit board with the components mounted on it in order to allow the user to determine whether the design of the circuit board meets the user's desired physical constraints. For example, the user may check whether any of the components are too large to fit within a desired package within which the circuit board will be installed. If the design of the circuit board does not fit within these constraints, the user can move, replace, rescale, or make other changes to the design.

If the user is satisfied with the design of the circuit board, the design may be exported so that the circuit board may be manufactured. In an embodiment, the system 100 may be configured to export the design to design files, such as Gerber files and Excellon Drill files, as shown in block 320.

In some embodiments, a bill of materials may be viewed and/or exported with the design files, where the bill of material may specify the components used, part numbers, part locations, voltage requirements, tolerance, quantities, part sizes, part locations, voltage requirements, tolerance, and/or any other information required to place, solder, and build the final circuit board.

In an embodiment, the design of the circuit board may next be communicated to the manufacturing tool 170, as shown in block 322. In an alternative embodiment, the design of the circuit board may be communicated directly to the manufacturing tool 170 via the API server 150, instead of generating any design files.

In some embodiments, the system 100 may communicate with external manufacturers to create an order for users that do not have the ability to do so themselves. The system 100 may also be configured to create an automated on rails experience that would transfer design files over the communication network 120.

The system 100 may be configured to assist the user in determining the best placement of a selected component on the circuit board in a variety of manners. In one embodiment, the system 100 stores placement information associated with one or more of the components that are available in the central database 160. For predefined circuit board footprints, the information may include a map showing the desirability of each location within a particular footprint.

In some embodiments, the map may associate values with each portion of the region, where higher values indicate more preferred positions. When the use selects a component to be placed on the circuit board, the system 100 may retrieve the map and use the map to provide feedback to the user regarding particular placement of the component. For example, the feedback may be color coding. As the component is moved around the design window, it is may be highlighted with a color indicating the desirability of the component's current position within the footprint of the circuit board.

Alternative embodiments may use other means to guide the positioning of component on the circuit board. In one embodiment, a component is selected, the system 100 may provide an outline of the component in a preferred position and the user may choose to place the component in the indicated position or elsewhere on the circuit board.

In another embodiment, the component may snap to a preferred position when it is dragged to within a predetermined radius of this position. In yet another embodiment, the system 100 may provide a numeric indication of the relative desirability of the new location (e.g., by showing a corresponding desirability value or by providing a warning when the user-selecting position is below a threshold level of desirability).

If the user has defined a circuit board footprint that is not selected from the predefined footprints in the system 100, the system 100 may not have a map corresponding to the custom-defined footprint. Instead, the system 100 may implement one or more rules that are associated with placement of the component on the circuit board. For example, if the selected component is a microprocessor, one of the associated placement rules may be that the component should not be placed within a certain distance of the edge of the circuit board. The system 100 may store the rules associated with a particular component with that component or they may be stored separately in the central database 160. The system 100 may control parameter placement of components based on the preferred locations of the components and the rotation of the component on the circuit board.

In some embodiments, placement rules may be provided by the system 100 for only a subset of the component, there may be some that can be placed in essentially any location on the circuit board without substantially affecting the performance of the circuit board.

In some embodiments, the process 300 further comprises the step of automatic scaling of components and/or connections/traces in the design of a circuit board. In one embodiment, the system 100 uses components and traces having a default scale. If the available footprint is filled prior to the design of the circuit board being complete, the user may initiate the system 100 to scale down the components and/or traces so that they occupy less space on the circuit board. Alternatively, the system 100 may automatically initiate the scaling of the components in response to a trigger, such as the user attempting to place an additional component on the circuit board when there is insufficient space to accommodate it.

In one embodiment, the system 100 initially uses power and ground traces having a width of about 0.635 mm and may scale the traces down to a minimum of about 0.508 mm. In this embodiment, signal traces may initially have a width of about 0.381 mm and may scale down a minimum of about 0.254 mm or 0.152 mm. The traces may be scaled up to essentially any extent.

The system 100 may allow a user to dynamically select between through holes, male headers, female headers, or pads for input and output options when designing a circuit board. The system 100 may also allow a user to dynamically select the location of desired mounting holes, through holes, and/or vias.

Vias, through holes, and mounting holes may have initial starting sizes that may be scaled up or down. In one embodiment, vias have an initial hole diameter of about 0.4 mm and may scale from about 0.3 mm to about 0.7 mm. Through holes may have an initial diameter of about 1 mm and scale from about 0.6 mm to about 1.6 mm. Mounting holes may have an initial diameter of about 3.2 mm and scale from 2.2 mm to about 4.2 mm. These values may vary in other embodiments.

If different sizes of a component are available, the system 100 may be configured to scale the component up or down by selecting a larger or smaller package. The system 100 may scale some, but not all of the components.

The system 100 may convert between various units of measure to easily port designs between different manufacturing requirements.

The system 100 may include machine learning and advanced pathfinding algorithms to determine best-fit traces to connect component on a circuit board.

In an embodiment, the system 100 builds a scene graph from nodes that represent each drawing operation and metadata required to render each layer of a PCB printer. The nodes may be selected and manipulated independent to refine the design of the circuit board. The metadata includes information about the bounding volume of each graphics object along with coordinates for conductive pads that must be connected via traces. The system 100 stores a mapping of part combinations to pad connection to determine the highest priority routes for automatic trace generation. The graphics objects may be rendered to the scene while conductive layers may be rendered to a buffer texture used to build a 2-D grid. The 2-D grid may be used as an input to define avoidance regions for a path-finding algorithm to automatically connect pads together based on the mapping information.

The system 100 is configured to perform a design rules check of each circuit board design in order to test that no traces cross, that the orientation of the components is correct, and that the components are connecting in the correct manner.

The system 100 may generate all required files to print multilayer circuit boards, including copper layers, drill layers, solder masks, silk screens, board profiles, and bill of material files. The system 100 also support converting file formats to accommodate various manufacture specifications.

The system 100 is further configured to allow users to save projects; create new projects; track the number of user projects that they have created, completed, and delivered; customize projects by adding sensor features; and share projects where users can collaborate.

The embodiments disclosed herein provide numerous benefits over conventional circuit board design systems. The system 100 disclosed herein does not require that a user have any special training or expertise in circuit board design or know any components that are needed in the circuit board design. Through automatic or guided placement of components on a circuit board, automatic population of required ancillary components, and automatic scaling of components and traces, a user with no education or training in circuit board design may successfully and quickly design and make working circuit boards.

The figures provided herein are merely representational and may not be drawn to scale. Certain proportions thereof may be exaggerated, while others may be minimized. Accordingly, the specification and drawings are to be regarded in an illustrative rather than a restrictive sense. It will, of course, be understood that, although particular embodiments have just been described, the claimed subject matter is not limited in scope to a particular embodiment or implementation. Likewise, an embodiment may be implemented in any combination of systems, methods, or products made by a process, for example.

In the preceding description, various aspects of claimed subject have been described. For purposes of explanation, specific numbers, systems, and/or configurations were set forth to provide a thorough understanding of claimed subject matter. Computer file types and languages, and operating system examples have been used for purposes of illustrating a particular example. However, it should be apparent to one skilled in the art having the benefit of this disclosure that claimed subject matter may be practiced with many other computer languages, operating systems, file types, and without these specific details. In other instances, features that would be understood by one of ordinary skill were omitted or simplified so as not to obscure claimed subject matter. While certain features have been illustrated or described herein, many modifications, substitutions, changes or equivalents will now occur to those skilled in the art. It is, therefore, to be understood that claims are intended to cover all such modifications or changes as fall within the true spirit of claimed subject matter.

What is claimed is:

1. A computer-implemented method allowing a user to design and make a circuit board, the method comprising:
    the user, via a computing device, defining an impression for the circuit board by customizing one or more shapes, one or more dimensions, and/or one or more sizes of the circuit board;
    the user selecting one or more first components from a library on a database and placing the first components on the circuit board;
    obtaining data and/or information from the database, wherein the data and/or information is associated with one or more regions and/or one or more rules for guiding the users placement of the first components on the circuit board;
    the user identifying one or more second components from the library based on the selection of the first components and placing the second components on the circuit board based on the placement of the first components, wherein the second components are ancillary to the first components;
    the user making a connection via signal traces between each of the first components and each of the second components on the circuit board;
    the user determining whether any additional first components will be placed on the circuit board;
    generating an image of a design of the circuit board designed by the user; and
    exporting the image of the design of the circuit board.

2. The computer-implemented method of claim 1, further comprising exporting data and/or information associated with the designed circuit board.

3. The computer-implemented method of claim 2, wherein the data and/or information associated with the designed circuit board is a bill of materials.

4. The computer-implemented method of claim 2, further comprising transmitting the data and/or information associated with the designed circuit board to a manufacturing tool, wherein the manufacturing tool is configured to make the designed circuit board.

5. The computer-implemented method of claim 1, wherein the impression includes one or more shapes, one or more dimensions, and/or one or more sizes of the circuit board.

6. The computer-implemented method of claim 1, wherein the image is a three-dimensional image and/or a two-dimensional image.

7. The computer-implemented method of claim 1, further comprising scaling the first components, second components, and/or the connection between each of the first components and each of the second components.

8. A system for designing and making a circuit board, the system comprising:
   a database operably configured to store data and/or information associated with the circuit board, one or more first components, and one or more second components, wherein the second components are ancillary to the first components;
   a user computing device operably configured to define an impression for the circuit board, wherein the impression includes one or more shapes, one or more dimensions, and/or one or more sizes of the circuit board, to select and place one or more of the first components and one or more of the second components from the database on the circuit board, and to make a connection via signal traces between each of the first components and the second components on the circuit board, wherein the placement of the second components is based on the placement of the first components;
   a database server operably configured to obtain data and/or information from the database, wherein the data and/or information is associated with one or more regions and/or one or more rules for placement of the first components on the circuit board, and to export an image of a design of the circuit board;
   an API server operably configured to receive and transmit data received from the user computing device; and
   a computing platform with a graphical user interface configured for display of the designed circuit board.

9. The system of claim 8, wherein the API server is further operably configured to transmit the data and/or information associated with the designed circuit board to a manufacturing tool, wherein the manufacturing tool is configured to make the designed circuit board.

10. The system of claim 8, wherein the designed circuit board is displayed as a three-dimensional image and/or a two-dimensional image.

11. A computer-implemented method allowing a user to design and make a circuit board, the method comprising:
   the user, via a computing device, defining an impression for the circuit board by customizing one or more shapes, one or more dimensions, and/or one or more sizes of the circuit board;
   upon defining an impression for the circuit board, the user selecting one or more first components from a library on a database and placing the first components on the circuit board;
   obtaining data and/or information from the database, wherein the data and/or information is associated with one or more regions and/or one or more rules for guiding the users placement of the first components on the circuit board;
   the user identifying one or more second components from the library based on the selection of the first components and placing the second components on the circuit board based on the placement of the first components, wherein the second components are ancillary to the first components;
   automatically making a connection via signal traces between each of the first components and each of the second components on the circuit board;
   the user determining whether any additional first components will be placed on the circuit board; and
   generating an image of a design of the circuit board designed by the user.

12. The computer-implemented method of claim 11, further comprising, prior to placing the first components on the circuit board, generating a map displaying information regarding the desirability of placement of the first components on the circuit board.

13. The computer-implemented method of claim 11, further comprising exporting an image of the design of the circuit board.

* * * * *